(12) United States Patent
Thomas

(10) Patent No.: US 6,242,773 B1
(45) Date of Patent: *Jun. 5, 2001

(54) SELF-ALIGNING POLY 1 ONO DIELECTRIC FOR NON-VOLATILE MEMORY

(75) Inventor: Jack F. Thomas, Palo Alto, CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/163,310

(22) Filed: Sep. 30, 1998

(51) Int. Cl.[7] .......................... H01L 29/788; H01L 29/76
(52) U.S. Cl. .......................... 257/315; 257/316; 257/317; 257/319
(58) Field of Search .................................. 257/315, 317, 257/319, 316

(56) References Cited

U.S. PATENT DOCUMENTS

| 5,229,631 | * | 7/1993 | Woo | 257/314 |
| 5,455,790 | * | 10/1995 | Hart et al. | 365/185.11 |
| 5,553,018 | * | 9/1996 | Wang et al. | 365/185.01 |
| 5,554,552 | * | 9/1996 | Chi | 437/43 |
| 5,585,656 | * | 12/1996 | Hsue et al. | 257/321 |
| 5,616,941 | * | 4/1997 | Roth et al. | 257/315 |
| 5,619,052 | * | 4/1997 | Chang et al. | 257/321 |
| 5,670,809 | * | 9/1997 | Saitoh | 257/316 |

* cited by examiner

Primary Examiner—Olik Chaudhuri
Assistant Examiner—Shrinivas H Rao

(57) ABSTRACT

Non-volatile memory semiconductor device manufacturing throughput is increased by simultaneously patterning the floating gate layer and dielectric layer formed thereon. Embodiments include forming sidewall dielectric layers joined with one of the isolation insulating regions to enhance insulation of the floating gate electrode.

10 Claims, 4 Drawing Sheets

SELF-ALIGNING POLY 1 ONO DIELECTRIC FOR NON-VOLATILE MEMORY

BACKGROUND OF THE INVENTION

1. Technical Field

The present invention relates to semiconductor devices and, more particularly, to a non-volatile memory device having sub-micron features.

2. Background of the Art

The escalating requirements for high density performance associated with ultra large scale integration semiconductor devices requires design features of 0.25 microns and under (e.g., 0.18 microns and under), increased transistor and circuit speeds, high reliability, and increased manufacturing throughput for competitiveness. The reduction of design features to 0.25 microns and under challenges the limitations of conventional semiconductor manufacturing techniques. Moreover, as design features are reduced into the deep sub-micron range, it becomes increasingly difficult to maintain or improve manufacturing throughput for competitiveness.

Memory devices are one class of examples of semiconductor devices that require high density performance and ultra large scale integration. Memory cells can take a variety of forms, some being both electrically erasable and electrically programmable (Electrically Erasable Programmable Read Only Memory, or EEPROMs), and others requiring special exposure techniques, such as ultraviolet light, for erasing (Erasable Programmable Read Only Memory, or EPROMs). Memory cells such as EEPROMs and EPROMs are often referred to as non-volatile memory devices because they are capable of storing and retaining a charge that corresponds to a specific value, even after to the circuit has been shut off. One of the most critical components for charge retention in non-volatile memory devices such as EPROMs is the interpoly dielectric. This dielectric functions to insulate the floating gate (a first polysilicon layer) from the control gate (which is typically formed as a second polysilicon layer) so that a charge may be stored in the floating gate. Accordingly, charge loss is a major consideration in fabricating semiconductor devices, such as memory cells, that must successfully retain a charge.

A flash or block erase EEPROM (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit line and a word line, and erased together as a block. An example of a memory cell of this type includes individual metal oxide semiconductor (MOS) memory cells. Each such MOS memory cells includes a source, drain, floating gate, and control gate to which various voltages are applied to program the cell with a binary 1 or 0. Each memory cell can be read by addressing it via the appropriate word and bit lines.

FIG. 2A illustrates an exemplary memory cell 200. As shown, the memory cell 200 is viewed in a cross-section through the bit line. The memory cell 200 includes a doped substrate 210 having a top surface 211, within which a source 212a and a drain 212b have been formed by selectively doping regions of a substrate 210. A tunnel oxide 215 separates a floating gate 216 from the substrate 210. An interpoly dielectric 224 separates the floating gate 216 from a control gate 226. The floating gate 216 and the control gate 226 are each electrically conductive and typically formed of polycrystalline silicon. A silicide layer 228 is disposed on top of the control gate 226, and functions to increase the electrical conductivity of the control gate 226. The silicide layer 228 is typically composed of a tungsten silicide (e.g., $WSi_2$) that is formed on top of the control gate 226 prior to patterning, using conventional deposition and annealing processes.

The memory cell 200 can be programmed, for example, by applying an appropriate programming voltage to the control gate 226. Similarly, the memory cell 200 can be erased, for example, by applying an appropriate erasure voltage to a source 212a. When programmed, the floating gate 216 will have a charge corresponding to either a binary 1 or 0. By way of example, the floating gate 216 can be programmed to a binary 1 by applying a programming voltage to the control gate 226, which causes an electrical charge to build up on the floating gate 216. If the floating gate 216 does not contain a threshold level of electrical charge, then the floating gate 216 represents a binary 0. During erasure, the charge is removed from the floating gate 216 by way of the erasure voltage applied to the source 212a.

FIG. 2B illustrates a cross-section of several adjacent memory cells from the perspective of a cross-section through the word line (i.e., from perspective A—A, as referenced in FIG. 2A). FIG. 2B reveals that individual memory cells are separated by isolation regions of silicon dioxide formed on the substrate 210. For example, FIG. 2B shows a portion of a first floating gate 216a associated with a first memory cell, a second floating gate 216b associated with a second memory cell, and a third floating gate 216c associated with a third memory cell. The first floating gate 216a is physically separated and electrically isolated from the second floating gate 216b by a first field oxide 214a. The second floating gate 216b is separated from the third floating gate 216c by a second field oxide 214b. The floating gates 216a, 216b, 216c are typically formed by selectively patterning a single conformal layer of polysilicon that has been previously deposited over the exposed portions of the substrate 210, tunnel oxide 215, and field oxides 214a–b. The interpoly dielectric layer 224 is conformably deposited over the exposed portions of the floating gates 216a–c and the field oxides 214a–b. The interpoly dielectric layer 224 isolates the floating gates 216a–c from the next conformal layer, which is typically a polysilicon layer that is patterned (e.g., along the bit line) to form the control gate 226. The interpoly dielectric layer 224 typically includes a plurality of films such as, for example, a bottom film of silicon dioxide, a middle film of silicon nitride, and a top film of silicon dioxide. This type of interpoly dielectric layer is commonly referred to as an oxide-nitride-oxide (ONO) layer.

The continued shrinking of memory cells, and in particular the features depicted in the memory cells of FIGS. 2A and 2B, places a burden on the fabrication process to deposit/form the floating gate 216 and control gate 226 without creating deleterious effects within the memory cell. Of particular concern, is the need to provide adequate isolation between each of the floating gates 216a–c, and between the floating gates 216a–c and the control gate 226, while also providing an adequately arranged floating/control gate configuration.

As previously stated, a key factor in charge retention is the effectiveness of insulating the floating gate. Difficulty has been encountered in increasing manufacturing throughput and cost effectiveness of memory cells, because the manufacturing steps are complex and expensive. Furthermore, it is difficult to efficiently process multiple layers of devices such as memory cells without creating deleterious effects.

Conventional methodology for fabricating floating gates is illustrated in FIGS. 3A–3C, wherein similar reference numerals denote similar features. Referring to FIG. 3A, there is shown a floating gate structure during an early stage of fabrication. As shown in FIG. 3A, a semiconductor substrate 310 contains isolation regions 312, such as field oxide regions. A tunnel dielectric or tunnel oxide 314 is formed on the surface of the semiconductor substrate 310 at a location between field oxides 312. A layer of polycrystalline silicon 316 (polysilicon) is deposited on the entire semiconductor substrate 310, including field oxides 312 and tunnel oxide 314. Next, polysilicon layer 316, and tunnel oxide 314 are patterned, as by conventional lithographic and etching techniques, in a process that is commonly referred to as poly 1 etch, the poly 1 reference being indicative of a first layer on polysilicon.

Referring now to FIG. 3B, dielectric layer 318 is subsequently formed on the semiconductor substrate 310, including the patterned polysilicon layer 316 and tunnel oxide 314. The dielectric layer 318 functions to insulate the polysilicon layer 316 and prevent a loss of charge. The dielectric layer 318 is often composed of three layers, namely a first oxide layer, an intermediate nitride layer, and a second oxide layer (ONO).

Dielectric layer 318 is then patterned around the polysilicon layer 316 as shown in FIG. 3C. This patterning step is both critical and expensive because the polysilicon layer 316 must be completely insulated. As an alternative, dielectric layer 318 can be patterned identically to the polysilicon layer 316 (not shown). Such an arrangement, however, requires the formation of sidewall spacers (not shown) in order to provide effective insulation of the polysilicon layer 316.

Accordingly, a disadvantage associated in fabricating semiconductor devices that must retain a charge, such as such non-volatile memory devices having floating gates, is the complexity and expense associated with conventional methodologies.

There is, therefore, a need for a cost effective and expedient non-volatile memory cell methodology and for memory cells with improved charge retention.

DISCLOSURE OF THE INVENTION

An advantage of the present invention is a cost-effective, expedient method of manufacturing semiconductor devices.

These and other advantages are attained by the present invention by simultaneously patterning the interpoly dielectric layer and underlying poly 1 layer, thereby eliminating the independent patterning steps performed in conventional methodology.

According to one aspect of the invention, a method of manufacturing a semiconductor device comprises: forming isolation regions on a semiconductor substrate and defining and active region therebetween; forming a first dielectric layer having a relatively thin thickness between the isolation regions and on the active region; forming a first conductive layer on the isolation regions and the first dielectric layer; forming a second dielectric layer on the first conductive layer; patterning the second dielectric layer, first conductive layer, and the first dielectric layer to form an insulated gate electrode stack comprising a first and second sidewall surface; forming a third dielectric layer on the patterned insulated gate electrode stack; and forming side dielectric layers on the first and second sidewalls of the patterned insulated gate electrode stack. By simultaneously patterning the second dielectric layer, the first conductive layer, and the first dielectric layer to form a patterned insulated gate electrode stack, and forming side dielectric layers on the first and second sidewalls of the patterned insulated gate electrode stack, the expense and time associated with patterning the dielectric layer is eliminated, while still providing effective insulation for the first conductive layer. According to a specific embodiment of the invention, the second dielectric layer may be in the form of a composite that includes a layer of oxide and a layer of nitride, or a tri-layer of oxide/nitride/oxide.

According to another aspect of the invention, a semiconductor device comprises: a pair isolation regions formed on a semiconductor substrate; a first dielectric layer formed between said pair of isolation regions, said first dielectric layer having a relatively thin thickness; a first gate electrode on said first dielectric layer; a second dielectric layer on said first gate electrode; and a third dielectric on said first gate electrode and said second dielectric layer. Additionally, the first gate electrode and the first, second, and third dielectric layers form an insulated gate electrode stack having first and second side surfaces. The semiconductor device according to the present invention provides effective insulation for the first conductive layer, hence resulting in improved charge retention.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The present invention enables the manufacture of semiconductor memory devices exhibiting improved charged retention, while reducing the expense and time required to manufacture such devices. Such an objective has proven quite elusive, particularly in semiconductor memory devices having a design feature of 0.25 microns and under. A semiconductor memory device produced in accordance with the present invention exhibits improved charge retention and reduces manufacturing costs by virtue of the formation of an insulation layer on a conductive layer, prior to patterning to form a floating gate. The inventive method of forming the insulation layer on the conductive layer comprises simultaneously patterning the insulation layer, the conductive layer, and a tunnel oxide layer formed directly on the substrate. Accordingly, the expense and time associated with an additional patterning step is eliminated.

Figure 1A:
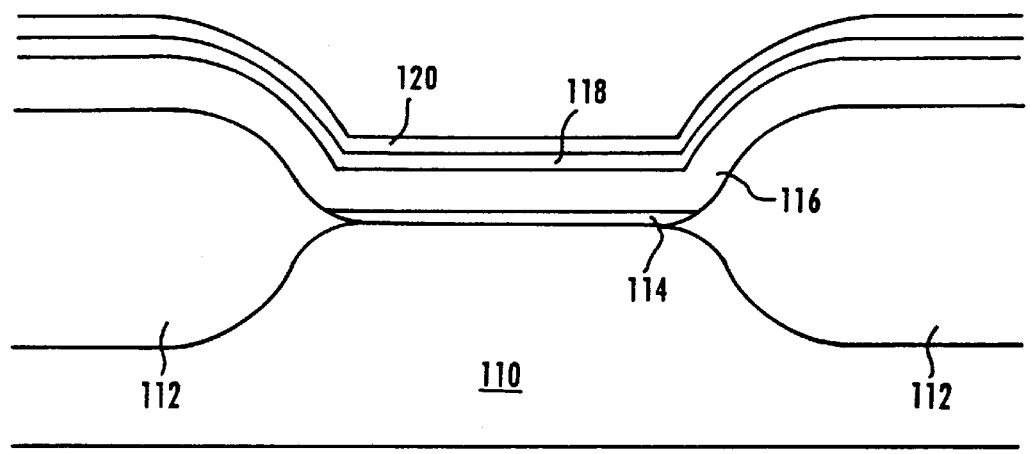
FIGS. 1A–1E illustratively represent sequential stages in a method of manufacturing a semiconductor device in accordance with an embodiment of the present invention.
Figure 1B:
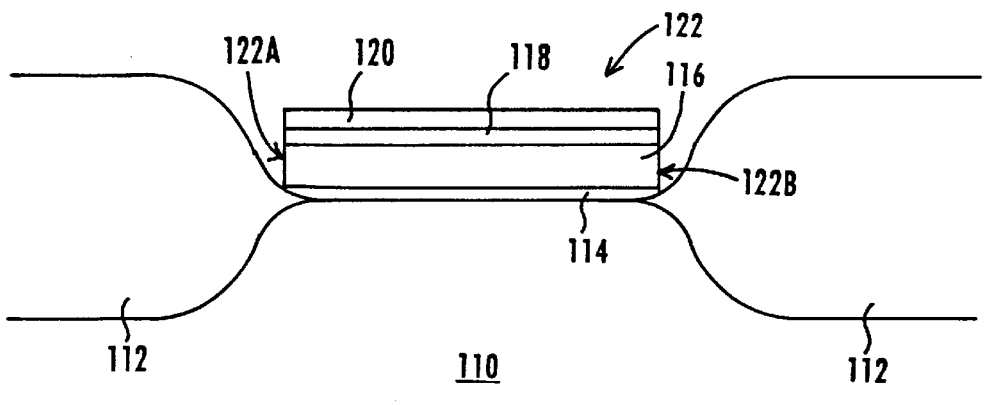

An embodiment of the present invention is schematically illustrated in FIGS. 1A–1E, wherein similar features bear similar reference numerals. Referring to FIG. 1A, isolation regions 112, e.g. field oxide regions, are formed on semiconductor substrate 110. The semiconductor substrate 110 may be in the form of monocrystalline silicon, and may be doped with either N-type or P-type dopants. The field oxides 112 are typically formed by oxidation in a conventional manner at a suitable thickness, e.g. about 2,000 to about 3,000 Angstroms (Å).

Next, a dielectric layer 114, such as a tunnel oxide layer, is formed on the semiconductor substrate, as shown in FIG. 1A, between field oxides 112. The tunnel oxide 114 is typically formed at a relatively small thickness, e.g., about 100 Å. Next, a first conductive layer 116, which can ultimately serve as the floating gate electrode of a non-volatile memory device, e.g., EEPROM, is formed on semiconductor substrate 110, e.g., doped polycrystalline silicon. Conductive layer 116 can be formed by way of various conventional techniques, e.g., deposition such as chemical vapor deposition (CVD) or plasma enhanced chemical vapor deposition (PECVD).

The present invention digresses from conventional methodology by forming a second dielectric layer on the first conductive layer 116, before patterning to form the floating gate electrode. The second dielectric layer is preferably a composite which typically comprises a silicon oxide layer 118 and a layer of silicon nitride 120. As illustrated in FIG. 1A, the silicon oxide layer 118 is formed directly on the first conductive layer 116, while the silicon nitride 120 is formed directly on the silicon oxide 118. Hence, both the silicon oxide layer 118 and the silicon nitride layer 120 extend over the entire semiconductor substrate 110. Next, the first conductive layer 116 and the first dielectric layer (silicon oxide 118 and silicon nitride 120), as well as the underlying tunnel oxide layer 114 are simultaneously patterned to form an insulated gate electrode stack 122 comprising first 122a and second 122b side surfaces. According to one embodiment of the present invention, a top oxide layer may be formed on the silicon nitride layer 120 (preferably by oxidation), and the insulated gate electrode stack 122 may be formed by simultaneously patterning the first conductive layer 116, the silicon oxide 118, the silicon nitride 120, the top oxide layer, and the underlying tunnel oxide layer 114.

Patterning to form gate electrode stack 122 in a conventional manner is accomplished by applying a layer of an appropriate photoresist (not shown for illustrative convenience) on the silicon nitride layer 120. A mask or reticle corresponding to the pattern of the insulated gate electrode 122 is precisely aligned with the semiconductor substrate 110. The photoresist is then exposed and developed. Etching is subsequently conducted, and the second dielectric layer (silicon oxide 118 and silicon nitride 120) and the polymerized photoresist removed, leaving gate electrode stack 122. An anisotropic etching technique is typically employed to etch the layers.

Figure 1C:
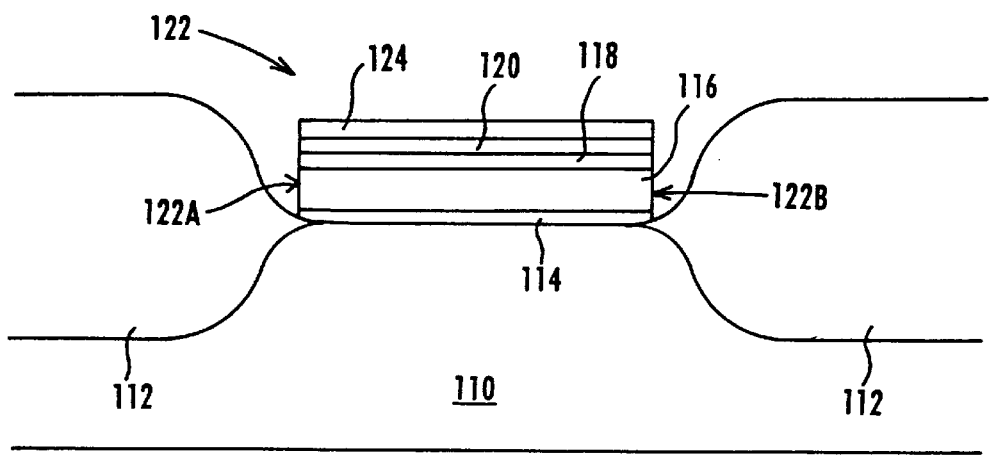

Referring to FIG. 1C, a third dielectric layer 124, e.g., silicon oxide, is formed on the insulated gate electrode 122 to complete an ONO composite on the first conductive layer 116. The third dielectric layer 124 may be formed on the silicon nitride 120 using conventional methods, such as oxidation, CVD, or PECVD (in part or in combination).

Figure 1D:
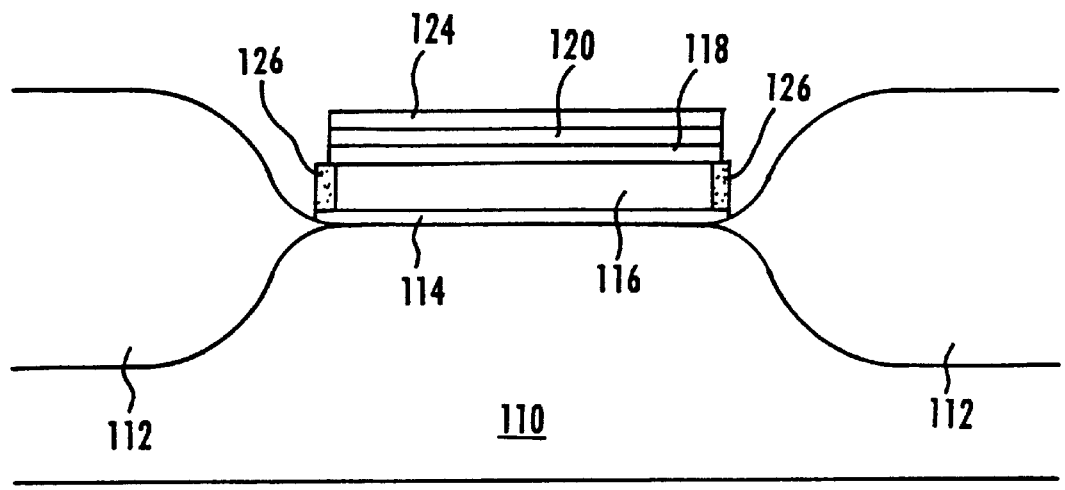

Subsequent to, or as part of, deposition of the third dielectric layer 124, sidewall dielectric layers 126 are formed on the first and second side surfaces 122a–b of the insulated gate electrode stack 122, as illustrated in FIG. 1D.

The sidewall dielectric layers 126 can comprise any dielectric material, e.g., silicon oxide, and can be formed by conventional methods, such as oxidation or deposition of an oxide layer. According to the disclosed embodiment, the sidewall dielectric layers 126 are formed by oxidation, as evidenced by the depletion of the first conductive layer 116. Sidewall dielectric layers 126 are formed at a thickness bridging part of the space between floating gate electrode 116 and field oxide regions 112, e.g., about 100—about 400 Å.

As shown in FIG. 1D, sidewall dielectric layers 126 are joined with field oxides 112 and the silicon oxide layer 118 of the second dielectric layer. As a result, the floating gate electrode layer 116 is insulated on all sides, i.e., a tunnel oxide layer 114 on the bottom surface, a sidewall dielectric layer 126 on each side surface, and the ONO layers (118, 120, 124) on the top surface.

Figure 1E:
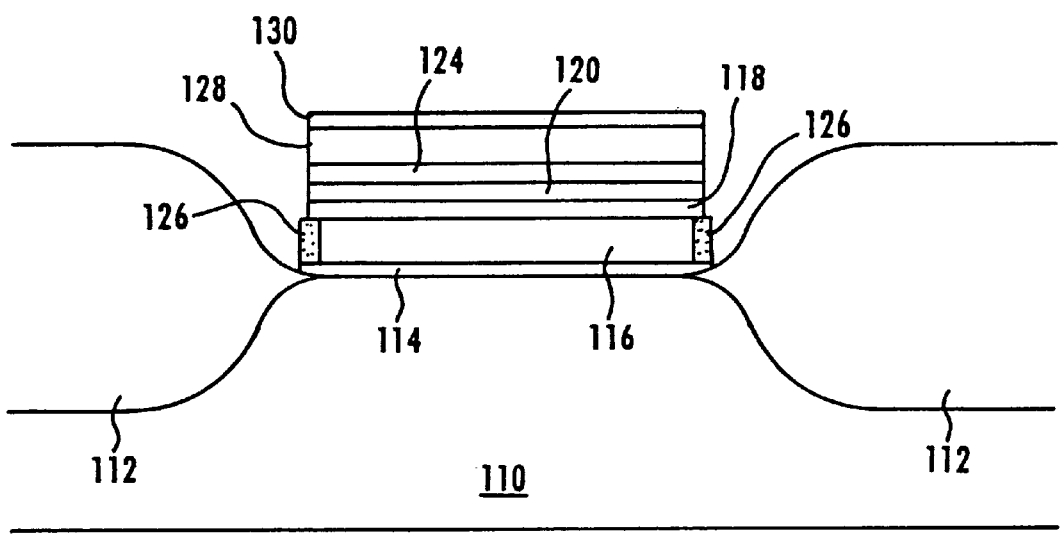
Figure 2A:
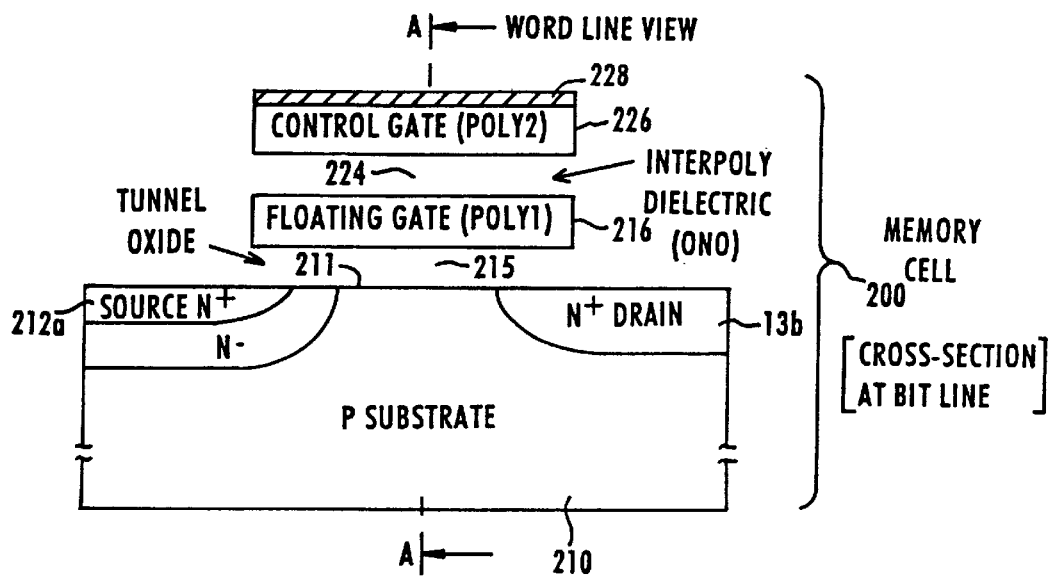
FIG. 2A is a cross-sectional view across the bit line of a conventional memory cell.
Figure 2B:
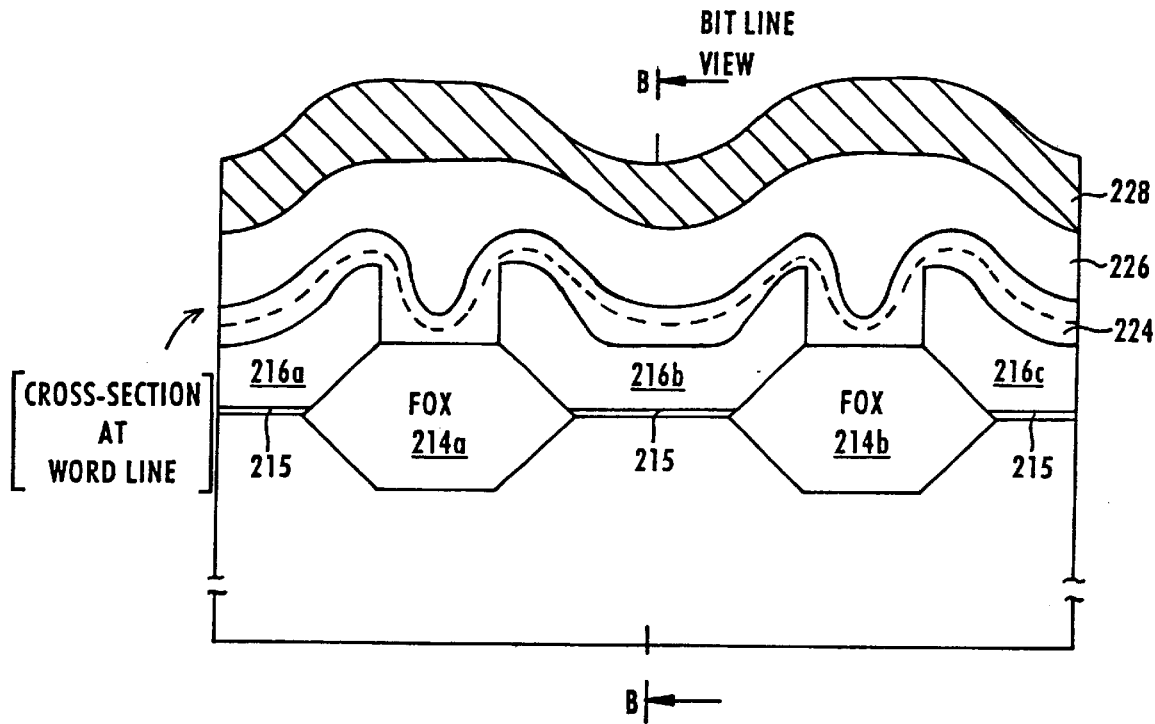
FIG. 2B is a cross-sectional view across the word line of a conventional memory cell.
Figure 3A:
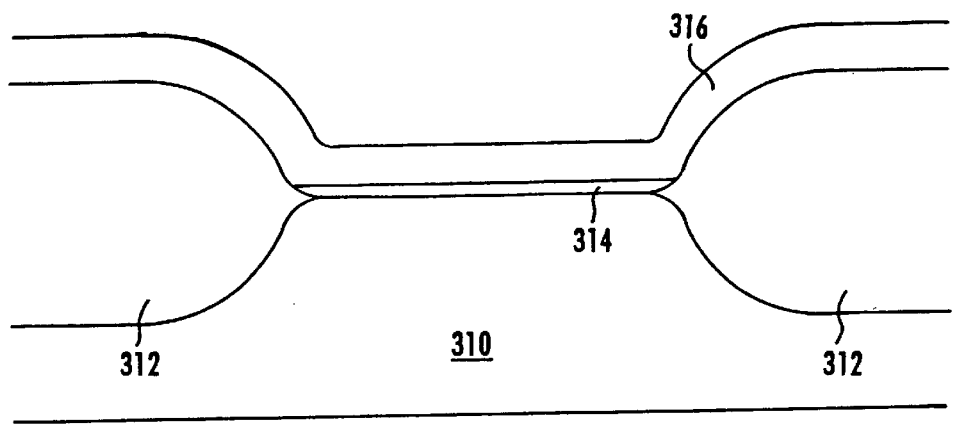
FIGS. 3A–3C represent sequential stages in a conventional method of manufacturing a semiconductor device.
Figure 3B:
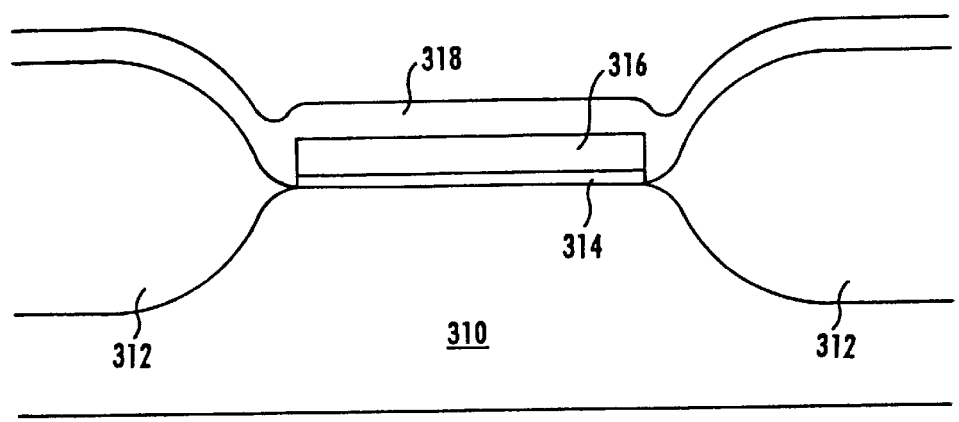
Figure 3C:
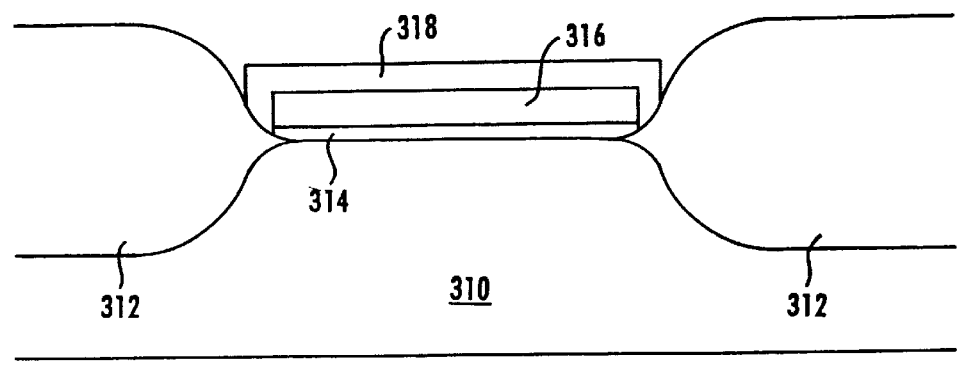

In manufacturing a non-volatile memory semiconductor device, a second conductive layer 128, or control gate, is formed on the third dielectric layer 124 by CVD or PECVD, as illustrated in FIG. 1E. A layer of silicide 130 may, for example, be formed on the second conductive layer 128 in order to increase electrical conductivity. The silicide layer 130, is typically tungsten silicide and formed on the second conductive layer 128 using conventional deposition and annealing processes.

The present method provides effective gate electrode insulation, particularly for floating gate electrodes, thereby enhancing charge retention. Additionally, the present method eliminates steps associated with performing a second (or third) patterning step, thereby enhancing throughput.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail in order to not unnecessarily obscure the present invention. For example, the dielectric materials can comprise a nitride, such as silicon nitride, silicon oxynitride, or silicon oxime.

The present invention is applicable to manufacturing any of various types of semiconductor devices. The present invention is particularly applicable to non-volatile memory devices having submicron features, e.g. 0.18 microns and under. Only the preferred embodiment of the present invention and an example of its versatility are shown and described in the present disclosure. It is to be understood that the invention is capable of use in various other combinations and environments and is capable of changes or modifications within the scope of the inventive concept expressed herein.

What is claimed is:

1. A semiconductor device comprising:
    a first dielectric layer formed on a semiconductor substrate between isolation regions;
    a first gate electrode on said first dielectric layer;
    a second dielectric layer on the first gate electrode;
    a third dielectric layer on said first gate electrode and the second dielectric layer, wherein the first gate electrode, and the first, second, and third dielectric layers form an insulated gate electrode stack having first and second side surfaces; and
    sidewall dielectric layers formed on a portion of the first and second side surfaces of said insulated gate electrode, said sidewall dielectric layers extending from said first dielectric layer to a top surface of said first gate electrode;

wherein each of said side dielectric layers covers at least a side surface of the first gate electrode and is joined to one of the isolation regions.

2. The semiconductor device according to claim 1, further comprising a second gate electrode on said third dielectric layer.

3. The semiconductor device according to claim 1, wherein each isolation layer comprises a field oxide having a thickness of 2000 Å to 3000 Å.

4. The semiconductor device according to claim 1, wherein said first dielectric layer comprises silicon oxide.

5. The semiconductor device according to claim 4, wherein said silicon oxide layer has a thickness up to 100 Å.

6. The semiconductor device according to claim 1, wherein said side dielectric layers comprise silicon oxide.

7. The semiconductor device according to claim 6, wherein said side dielectric layers include a thickness of 200 Å to 400 Å.

8. The semiconductor device according to claim 1, wherein said second dielectric layer comprises:

a layer of silicon oxide formed on said first gate electrode layer; and a layer of silicon nitride formed on the layer of silicon oxide.

9. The semiconductor device according to claim 1 further comprising a second gate electrode on said third dielectric layer.

10. The semiconductor device according to claim 9, further comprising a layer of silicide formed on said second gate electrode.

* * * * *